United States Patent
Chen

(10) Patent No.: US 7,586,332 B2
(45) Date of Patent: Sep. 8, 2009

(54) OFF-CHIP DRIVER

(75) Inventor: Chih-Jen Chen, Kaohsiung County (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 11/829,086

(22) Filed: Jul. 27, 2007

(65) Prior Publication Data

US 2008/0278199 A1   Nov. 13, 2008

(30) Foreign Application Priority Data

May 7, 2007   (TW) .................... 96116124 A

(51) Int. Cl.
*H03K 19/094* (2006.01)
(52) U.S. Cl. ................ 326/87; 326/57; 327/108
(58) Field of Classification Search ............. 326/30, 326/56–58, 82, 83, 86, 87; 327/108, 109
See application file for complete search history.

(56) References Cited

U.S. PATENT DOCUMENTS

| | | | | |
|---|---|---|---|---|
| 5,929,654 A | * | 7/1999 | Park et al. ............. | 326/58 |
| 6,812,732 B1 | * | 11/2004 | Bui ..................... | 326/30 |
| 2004/0217774 A1 | * | 11/2004 | Choe ................... | 326/30 |
| 2004/0257126 A1 | * | 12/2004 | Choi et al. ............ | 327/108 |
| 2005/0259756 A1 | * | 11/2005 | Kasahara .............. | 375/257 |

* cited by examiner

*Primary Examiner*—James H. Cho
*Assistant Examiner*—Jany Tran
(74) *Attorney, Agent, or Firm*—Jianq Chyun IP Office

(57) ABSTRACT

A driver includes a plurality of first PMOS transistors, a first resistor, an amplifier, a second PMOS transistor and a second resistor. The amplifier herein receives a reference voltage and outputs a regulating voltage. The above-mentioned reference voltage is produced in accordance with a band-gap reference voltage. Since the band-gap reference voltage is unlikely affected by a process variation, thus, the present invention is capable of providing an output current robust from process characteristic and the output current is more reliable to indicate a data signal.

17 Claims, 1 Drawing Sheet

OFF-CHIP DRIVER

CROSS-REFERENCE TO RELATED APPLICATION

This application claims the priority benefit of Taiwan application serial no. 96116124, filed May 7, 2007. All disclosure of the Taiwan application is incorporated herein by reference.

BACKGROUND OF THE INVENTION

1. Field of the Invention

The present invention generally relates to a driver, and more particularly, to a off-chip driver (OCD) providing output current.

2. Description of Related Art

In a circuit system, a semiconductor chip is able to produce different logical signals to control devices (loads) outside the chip. In general speaking, a semiconductor chip can includes an off-chip driver for delivering the above-mentioned logical signals to loads. An OCD usually includes P-channel field effect transistors (FETs) and N-channel field effect transistors as the major components thereof. Therese FETs are implemented by, for example, metal oxide semiconductor (MOS) transistors or complementary metal oxide semiconductor (CMOS) transistors.

The output signal of a conventional OCD can be sent to loads in driving current mode. Due to process variation however, the output current of a driver would be affected by the variation. Thus, a varied output voltage results in an up-drift or down-drift output current.

When an OCD is used in a dynamic random access memory (DRAM), the unstable driving current caused by a process variation may make a DRAM unqualified to meet the standard and specification worked out by Joint Electron Device Engineering Council (JEDEC). Moreover, the unstable driving current would affect the coupling compatibility of the DRAM with the loads (for example, coupling with a motherboard), which leads to a possible mistake with the data signal received by the loads.

SUMMARY OF THE INVENTION

Accordingly, the present invention is directed to provide a driver, which is robust from process variation and utilizes a reference voltage to regulate an output current. The driver is capable of outputting reliable data signals and outputting a driving current representing data signal.

The present invention provides a driver, which includes a plurality of first P-channel metal oxide semiconductors (first PMOS transistors), a first resistor, a first amplifier, a second PMOS transistor and a second resistor. The first source/drain terminals of all the first PMOS transistors are together coupled to a first operation voltage, the second source/drain terminals thereof are together coupled to an end of a first resistor and the gate terminals thereof are coupled to each other. Another end of the first resistor is the output terminal of the driver. The first amplifier has a first input terminal, a second input terminal and an output terminal, wherein the first input terminal is coupled to a first reference voltage and the output terminal is coupled to the gate terminal of every first PMOS transistor. The first source/drain terminal of the second PMOS transistor is coupled to the first operation voltage, the second source/drain terminal thereof is coupled to the second input terminal of the first amplifier and the gate terminal thereof is coupled to a first regulating voltage. An end of the second resistor is coupled to the second input terminal of the first amplifier and another end thereof is coupled to a second operation voltage. Thus, the output terminal of the first amplifier outputs the first regulating voltage, wherein the first regulating voltage is suitable for regulating the drain currents of the first PMOS transistor and the second PMOS transistor.

According to the driver provided by an embodiment of the present invention, the above-mentioned first reference voltage is produced in accordance with a band-gap reference voltage. The number of the first PMOS transistors is M, wherein M is a positive integer. The second PMOS transistor and the first PMOS transistor have a same ratio of width over length of the channels thereof. The resistance of the second resistor is M times of the resistance of the first resistor. In another embodiment, a driver further includes N first NMOS transistors, a second amplifier, a second NMOS transistor, a third resistor, a third PMOS transistor, a third NMOS transistor, a fourth PMOS transistor, an inverter and a fourth NMOS transistor, wherein N is a positive integer. The second amplifier has a first input terminal, a second input terminal and an output terminal, wherein the first input terminal is coupled to a second reference voltage. The first source/drain terminals of all the first NMOS transistors are together coupled to a first resistor, the second source/drain terminals thereof are together coupled to a second operation voltage and the gate terminals thereof are together coupled to the output terminal of the second amplifier. The first source/drain terminals of the third PMOS transistor and the fourth PMOS transistor are together coupled to the first operation voltage; the second source/drain terminals of the third PMOS transistor and the fourth PMOS transistor are together coupled to a first regulating voltage; the second source/drain terminals of the second NMOS transistor, the third NMOS transistor and the fourth NMOS transistor are together coupled to a second operation voltage; the first source/drain terminals of the third NMOS transistor and the fourth NMOS transistor are together coupled to the output terminal of the second amplifier, the gate terminals of the third PMOS transistor and the third NMOS transistor receive a data signal; the gate terminal of the fourth PMOS transistor receives an enabling signal and is coupled to the input terminal of an inverter; the gate terminal of the fourth NMOS transistor is coupled to the output of the inverter; the gate terminal of the second NMOS transistor is coupled to the output terminal of the second amplifier; the second input terminal of the second amplifier is coupled to the first source/drain terminal of the second NMOS transistor and an end of the third resistor; another end of the third resistor is coupled to the first operation voltage. Thus, the output terminal of the second amplifier is able to output a second regulating voltage, wherein the second regulating voltage is suitable for regulating the drain currents of the first NMOS transistor and the second NMOS transistor. The second NMOS transistor and the first NMOS transistor have a same ratio of width over length of the channels thereof. The resistance of the third resistor is N times of the resistance of the first resistor.

The present invention also provides a driver, which includes a voltage-regulating circuit, a plurality of first PMOS transistors, a plurality of first NMOS transistors, a first resistor, a switching circuit and a data-receiving circuit. The voltage-regulating circuit receives a first reference voltage and a second reference voltage and outputs a first regulating voltage and a second regulating voltage, wherein the first reference voltage and the second reference voltage are produced in accordance with a band-gap reference voltage. All the first PMOS transistors are coupled to the voltage-regulating circuit, the first source/drain terminals thereof are together coupled to a first operation voltage, the gate terminals thereof are together coupled to the first regulating voltage and the second source/drain terminals thereof are together coupled to an end of the first resistor. Another end of the first resistor is the output terminal of the driver. All the first NMOS transistors are coupled to the voltage-regulating circuit, the first source/drain terminals thereof are together coupled to the second source/drain terminal of the first PMOS transistor, the second source/drain terminals thereof are together coupled to the second operation voltage and the gate terminals thereof are together coupled to the voltage-regulating circuit. The data-receiving circuit is coupled to the switching circuit and the gate terminals of the first PMOS transistor and the first NMOS transistor. The switching circuit receives an enabling signal, wherein the enabling signal controls the output of the driver. The data-receiving circuit receives a data signal and delivers the data signal according to the control of the switching circuit. The first regulating voltage herein is suitable for regulating the drain current of the first PMOS transistor, while the second regulating voltage is suitable for regulating the drain current of the first NMOS transistor.

Since the driver of the present invention adopts a band-gap reference voltage, makes the second PMOS transistor and the second NMOS transistor coupled to the amplifiers and uses the first transistors and the second transistor to form a set of current mirrors, so that when a drain current variation of the current mirror is detected by the amplifier, the output of the amplifier would quickly stabilize the gate terminal voltages of the first transistors and the second transistor, therefore, the driver is avoided from the influence of a process variation and the output driving current indicates the correct data signal.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
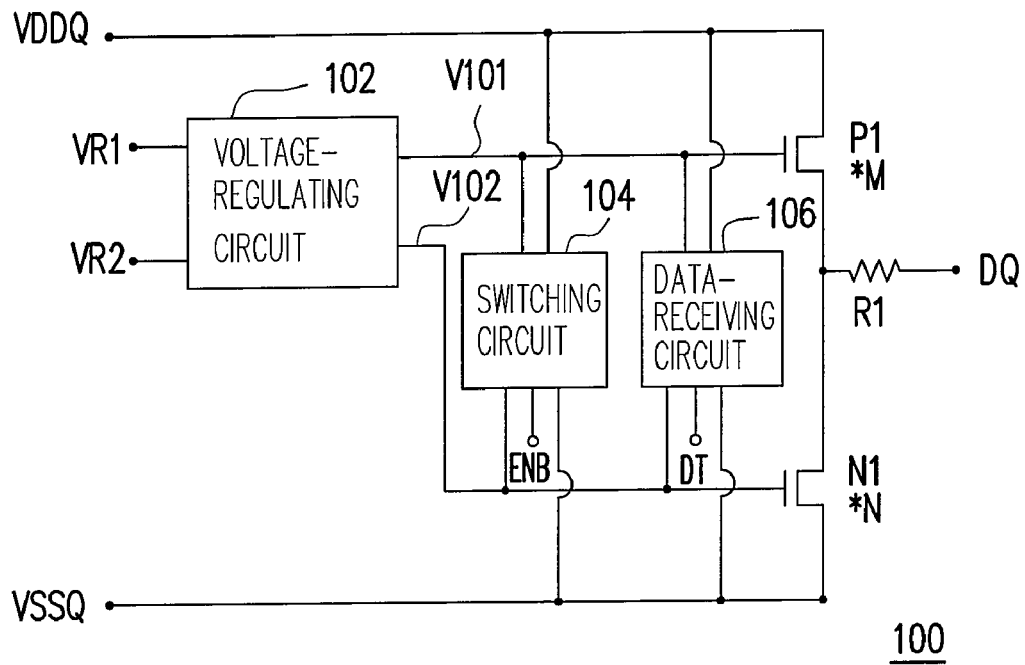
FIG. 1 is a circuit diagram of an off-chip driver according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a circuit diagram of an off-chip driver (OCD) according to an embodiment of the present invention. Referring to FIG. 1, a driver 100 includes M PMOS transistors P1, N NMOS transistors N1, a resistor R1, a voltage-regulating circuit 102, a switching circuit 104 and a data-receiving circuit 106, wherein M and N are positive integers, the output of the voltage-regulating circuit 102 is coupled to the switching circuit 104, the data-receiving circuit 106 and the PMOS transistors P1 and the NMOS transistors N1.

In the embodiment, the voltage-regulating circuit 102 can receives two reference voltages VR1 and VR2 to respectively output a first regulating voltage V101 and a second regulating voltage V102 for controlling each of the PMOS transistors P1 and each of the NMOS transistors N1. In some selected embodiments, the reference voltages VR1 and VR2 are produced according to a band-gap reference voltage, so that the levels of the reference voltages VR1 and VR2 are constant, where the reference voltages VR1 and VR2 can be served as the calibration voltage levels of the amplifiers DA1 and DA2.

Continuing to FIG. 1, in the driver 100, the first source/drain terminals of all the PMOS transistors P1 are together coupled to a operation voltage VDDQ, the gate terminals thereof are together coupled to an output of the voltage-regulating circuit 102 for receiving the first regulating voltage V101, the second source/drain terminals of all the PMOS transistors P1 are together coupled to an end of the resistor R1 and another end of the resistor R1 is coupled to the output terminal DQ of the driver 100.

Similarly, the first source/drain terminals of all the NMOS transistors N1 are together coupled to the second source/drain terminals of the PMOS transistors P1, the gate terminals thereof are together coupled to another output of the voltage-regulating circuit 102 for receiving the second regulating voltage V102, the second source/drain terminals of all the NMOS transistors N1 are together coupled to an operation voltage VSSQ.

Figure 2:
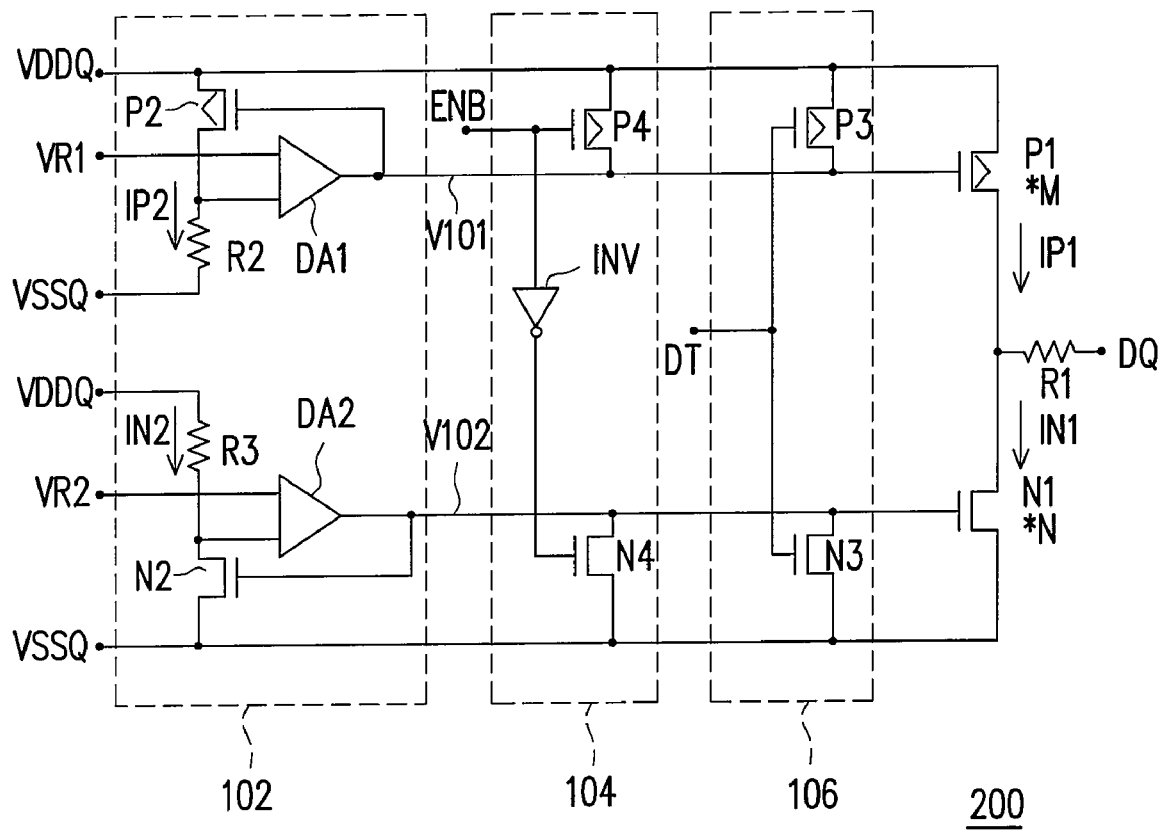
FIG. 2 is a circuit diagram of an off-chip driver according to another embodiment of the present invention.

In more detail, referring to FIG. 2, which is a circuit diagram of an off-chip driver according to another embodiment of the present invention. The voltage-regulating circuit 102 can include a PMOS transistor P2, an NMOS transistor N2, resistors R2 and R3 and amplifiers DA1 and DA2, wherein the first input terminal of the amplifier DA1 is coupled to a reference voltage VR1 and the output terminal of the amplifier DA1 is coupled to the gate terminals of M pieces of PMOS transistors P1 and the gate terminal of the PMOS transistor P2. Furthermore, the first source/drain terminal of the PMOS transistor P2 is coupled to the operation voltage VDDQ, and the second source/drain terminal of the PMOS transistor P2 is coupled to the second input terminal of the amplifier DA1 and via the resistor R2 to the operation voltage VSSQ.

Similarly, the first input terminal of the amplifier DA2 receives a reference voltage VR2 and the output terminal of the amplifier DA2 is coupled to the gate terminals of N pieces of NMOS transistors N1 and the gate terminal of the NMOS transistor N2. Furthermore, the first source/drain terminal of the NMOS transistor N2 is coupled to the second input terminal of the amplifier DA2 and via the resistor R3 to the operation voltage VDDQ, and the second source/drain terminal of the NMOS transistor N2 is coupled to the operation voltage VSSQ.

In the embodiment, the M pieces of PMOS transistors P1 and the PMOS transistor P2 have a same channel width and a same ratio of width over length of transistor channel, so that they form a first set of current mirrors. The current flowing a transistor is inverse-proportional to section area available for flowing the current, thus, the drain current of the PMOS transistor P2 can be expressed by the following equation:

$$IP2 = \frac{Wp1 \times Lp1}{M \times Wp2 \times Lp2} \times IP1 = \frac{1}{M} \times IP1$$

where Wp1, Lp1 are respectively the channel width and the channel length of the PMOS transistor P1, Wp2, Lp2 are respectively the channel width and the channel length of the PMOS transistor P2 and Ip1 is the drain current flowing through the M pieces of PMOS transistors P1.

Similarly, the N pieces of NMOS transistors N1 and the NMOS transistor N2 have a same channel width and a same ratio of width over length of transistor channel, so that they form a second set of current mirrors. The current flowing a transistor is inverse-proportional to section area available for flowing the current, thus, the drain current of the NMOS transistor N2 can be expressed by the following equation:

$$IN2 = \frac{Wn1 \times Ln1}{N \times Wn2 \times Ln2} \times IN1 = \frac{1}{N} \times IN1$$

where Wn1, Ln1 are respectively the channel width and the channel length of the NMOS transistor N1, Wn2, Ln2 are respectively the channel width and the channel length of the NMOS transistor N2 and In1 is the drain current flowing through the N pieces of NMOS transistors N1.

Since the M pieces of PMOS transistors P1 and the PMOS transistor P2 form the first set of current mirrors and the N pieces of NMOS transistors N1 and the NMOS transistor N2 form the second set of current mirrors, therefore, the variation of the drain current IP1 would affect the drain current IP2; in same way, the variation of the drain current IN1 would affect the drain current IN2. Taking the PMOS transistors P1 and the PMOS transistor P2 as an example, when the drain current IP1 gets smaller, the drain current IP2 also gets smaller. At the point, the amplifier DA1 would produce a first regulating voltage V101 to the gate terminal of the PMOS transistor P2 to regulate the drain current IP2 according to the comparison result between the two input terminals, and accordingly, the output current IP1 of the driver 200 can be simultaneously corrected; similarly, the amplifier DA2 would produce a second regulating voltage V102 to the gate terminal of the NMOS transistor N2 to regulate the drain current IN2 according to the comparison result between the two input terminals, and accordingly, the output current IN1 of the driver 200 can be simultaneously corrected.

Note that since the quantity of the PMOS transistors P1 is M times as many as the PMOS transistor P2 and the quantity of the NMOS transistors N1 is N times as many as the NMOS transistor N2, therefore, the drain currents IP1 and IN1 are respectively M times and N times of the drain currents IP2 and IN2. To solve the problem, the resistance of the resistors R2 and R3 in the present embodiment are designed to be respectively M times and N times of the resistance of the resistor R1.

Continuing to FIG. 2, the switching circuit 104 in the embodiment includes a PMOS transistor P4, an NMOS transistor N4 and an inverter INV. The first source/drain terminal of the PMOS transistor P4 is coupled to the operation voltage VDDQ, the second source/drain terminal thereof is coupled to the gate terminals of the PMOS transistors P1, the gate terminal thereof receives an enabling signal ENB and is via the inverter INV coupled to the gate terminal of the NMOS transistor N4. On the other hand, the first source/drain terminal of the NMOS transistor N4 is coupled to the gate terminals of the NMOS transistors N1 and the second source/drain terminal of the NMOS transistor N4 is coupled to the operation voltage VSSQ. When the enabling signal ENB takes a logical high level, the PMOS transistor P4 and the NMOS transistor N4 are off, and at the point, the driver 200 works normally. The data-receiving circuit 106 includes a PMOS transistor P3 and an NMOS transistor N3. The first source/drain terminal of the PMOS transistor P3 is coupled to the operation voltage VDDQ, the second source/drain terminal of the PMOS transistor P3 is coupled to the gate terminals F of all the PMOS transistors P1 and the gate terminal of the PMOS transistor P3 receives a data signal DT. Similarly, the first source/drain terminal of the NMOS transistor N3 is coupled to the gate terminals of all the NMOS transistors N1, the second source/drain terminal of the NMOS transistor N3 is coupled to the operation voltage VSSQ and the gate terminal of the NMOS transistor N3 is coupled to the gate terminal of the PMOS P3 and receives the data signal DT.

When the driver 200 works normally, the data signal is a logical high level, the PMOS transistors P1 are on. Meanwhile, the driver 200 would output a logic-1 data from the output terminal DQ. When the data signal is a logical low level, the NMOS transistors N1 are on. Meanwhile, the driver 200 would output a logic-0 data from the output terminal DQ.

In summary, since the driver of the present invention adopts a band-gap reference voltage, makes the second PMOS transistor coupled to an input terminal of the amplifier and uses the first transistors and the second transistor to form a set of current mirrors, so that when a drain current variation of the current mirrors is detected by the amplifier, the output of the amplifier would quickly stabilize the gate terminal voltages of the first transistors and the second transistor; the second set of current mirrors has the same operation principle as the above described. Therefore, the driver is avoided from the influence of a process variation occurred in the prior art and able to keep a stable output current, which insures the correctness of data signal to meet the relevant standard and specification.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A driver, comprising:
   a plurality of first PMOS transistors, comprising a first source/drain terminal, a second source/drain terminal and a gate terminal for each of the first PMOS transistors, wherein all the first source/drain terminals are together coupled to a first operation voltage, all the second source/drain terminals are coupled to each other and all the gate terminals are coupled to each other;
   a first resistor, comprising an end coupled to the second source/drain terminals of all the first PMOS transistors and another end served as the output terminal of the driver;
   a first amplifier, comprising a first input terminal coupled to a first reference voltage, a second input terminal, and an output terminal coupled to the gate terminals of all the first PMOS transistors and outputs a first regulating voltage;
   a second PMOS transistor, comprising a first source/drain terminal coupled to the first operation voltage, a second source/drain terminal coupled to the second input terminal of the first amplifier, and a gate terminal coupled to the first regulating voltage;
   a second resistor, comprising an end coupled to the second input terminal of the first amplifier and another end coupled to a second operation voltage, wherein the first regulating voltage is for regulating the drain currents of the first PMOS transistors and the second PMOS transistor;
   a plurality of first NMOS transistors, comprising a first source/drain terminal, a second source/drain terminal and a gate terminal for each of the first NMOS transistors, wherein all the first source/drain terminals are together coupled to the first resistor, all the second source/drain terminals are coupled to the second operation voltage and all the gate terminals are coupled to each other;

a second amplifier, comprising a first input terminal coupled to a second reference voltage, a second input terminal, and an output terminal coupled to the gate terminals of all the first NMOS transistors and outputs a second regulating voltage;

a second NMOS transistor, comprising a first source/drain terminal coupled to the second input terminal of the second amplifier, a second source/drain terminal coupled to the second operation voltage, and a gate terminal coupled to the output terminal of the second amplifier; and a third resistor, comprising an end coupled to the second input terminal of the second amplifier and another end coupled to the first operation voltage, wherein the second regulating voltage is for regulating the drain currents of the first NMOS transistors and the second NMOS transistor;

a third PMOS transistor, comprising a first source/drain terminal coupled to the first operation voltage, a second source/drain terminal coupled to the gate terminals of all the first PMOS transistors, and a gate terminal receiving a data signal; and a third NMOS transistor, comprising a first source/drain terminal coupled to the gate terminals of all the first NMOS transistors, a second source/drain terminal coupled to the second operation voltage, and a gate terminal receiving the data signal.

2. The driver according to claim 1, wherein the number of the first PMOS transistors is M and M is a positive integer.

3. The driver according to claim 2, wherein the resistance of the second resistor is M times of the resistance of the first resistor.

4. The driver according to claim 1, wherein the second PMOS transistor and the first PMOS transistors have a same ratio of width over length of transistor channel.

5. The driver according to claim 1, further comprising:
a fourth PMOS transistor, comprising a first source/drain terminal coupled to the first operation voltage, a second source/drain terminal coupled to the gate terminals of all the first PMOS transistors, and a gate terminal receiving an enabling signal;

an inverter, comprising an input terminal coupled to the gate terminal of the fourth PMOS transistor; and a fourth NMOS transistor, comprising a first source/drain terminal the gate terminals of all the first NMOS transistors, a second source/drain terminal coupled to the second operation voltage, and a gate terminal coupled to a output terminal of the inverter.

6. The driver according to claim 1, wherein the number of the first NMOS transistors is N and N is a positive integer.

7. The driver according to claim 6, wherein the resistance of the third resistor is N times of the resistance of the first resistor.

8. The driver according to claim 1, wherein the second NMOS transistor and the first NMOS transistors have a same ratio of width over length of transistor channel.

9. A driver, comprising:
a voltage-regulating circuit, receiving a first reference voltage and a second reference voltage to output a first regulating voltage and a second regulating voltage;

a plurality of first PMOS transistors, comprising a first source/drain terminal, a second source/drain terminal and a gate terminal for each of the first PMOS transistors, wherein all the first source/drain terminals are together coupled to a first operation voltage, all the second source/drain terminals are coupled to each other and all the gate terminals receive the first regulating voltage;

a plurality of first NMOS transistors, comprising a first source/drain terminal, a second source/drain terminal and a gate terminal for each of the first NMOS transistors, wherein all the first source/drain terminals are together coupled to the second source/drain terminals of all the first PMOS transistors, all the second source/drain terminals are coupled to a second operation voltage and all the gate terminals receive the second regulating voltage;

a first resistor, comprising an end coupled to the second source/drain terminals of all the first PMOS transistors and the first source/drain terminals of all the first NMOS transistors, and another end served as the output terminal of the driver;

a switching circuit, coupled to the output of the voltage-regulating circuit and controlling the output of the driver according to an enabling signal; and a data-receiving circuit, coupled to the switching circuit, the gate terminals of all the first PMOS transistors and all the first NMOS transistors, receiving a data signal and being controlled for transferring the data signal by the switching circuit, wherein the first regulating voltage is suitable for regulating the drain currents of the first PMOS transistors and the second regulating voltage is suitable for regulating the drain currents of the first NMOS transistors.

10. The driver according to claim 9, wherein the voltage-regulating circuit comprising:
a first amplifier, comprising a first input terminal coupled to the first reference voltage, a second input terminal, and an output terminal outputting the first regulating voltage;

a second PMOS transistor, comprising a first source/drain terminal coupled to the first operation voltage, a second source/drain terminal coupled to the second input terminal of the first amplifier, and a gate terminal coupled to the output terminal of the first amplifier; and a second resistor, comprising an end coupled to the second input terminal of the first amplifier, and another end coupled to the second operation voltage.

11. The driver according to claim 10, wherein the voltage-regulating circuit further comprises:
a second amplifier, comprising a first input terminal coupled to the second reference voltage, a second input terminal, and an output terminal outputting the second regulating voltage;

a second NMOS transistor, comprising a first source/drain terminal coupled to the second input terminal of the second amplifier, a second source/drain terminal coupled to the second operation voltage, and a gate terminal coupled to the output terminal of the second amplifier; and a third resistor, comprising an end coupled to the second input terminal of the second amplifier and another end coupled to the first operation voltage.

12. The driver according to claim 11, wherein the number of the first NMOS transistors is N, and N is a positive integer.

13. The driver according to claim 11, wherein the second NMOS transistor and the first NMOS transistors have a same ratio of width over length of transistor channel.

14. The driver according to claim 10, wherein the number of the first PMOS transistors is M, and M is a positive integer.

15. The driver according to claim 10, wherein the second PMOS transistor and the first PMOS transistors have a same ratio of width over length of transistor channel.

16. The driver according to claim 9, wherein the data-receiving circuit comprises:
- a third PMOS transistor, comprising a first source/drain terminal coupled to the first operation voltage, a second source/drain terminal coupled to the first regulating voltage, and a gate terminal receiving the data signal; and
- a third NMOS transistor, comprising a first source/drain terminal coupled to the second regulating voltage, a second source/drain terminal coupled to the second operation voltage, and a gate terminal receiving the data signal.

17. The driver according to claim 9, wherein the switching circuit comprises:
- a fourth PMOS transistor, comprising a first source/drain terminal coupled to the first operation voltage, a second source/drain terminal coupled to the first regulating voltage, and a gate terminal receiving the enabling signal;
- a fourth NMOS transistor, comprising a first source/drain terminal coupled to the second regulating voltage, a second source/drain terminal coupled to the second operation voltage, and a gate terminal; and
- an inverter, comprising an input terminal receiving the enabling signal, and an output terminal coupled the gate terminal of the fourth NMOS transistor.

* * * * *